US006562712B2

(12) United States Patent
Liu et al.

(10) Patent No.: US 6,562,712 B2
(45) Date of Patent: May 13, 2003

(54) MULTI-STEP PLANARIZING METHOD FOR FORMING A PATTERNED THERMALLY EXTRUDABLE MATERIAL LAYER

(75) Inventors: Chung-Shi Liu, Hsin-Chu (TW); Chen-Hua Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/898,597

(22) Filed: Jul. 3, 2001

(65) Prior Publication Data

US 2003/0008494 A1 Jan. 9, 2003

(51) Int. Cl.[7] .......................................... H01L 21/4763
(52) U.S. Cl. ........................ 438/631; 438/618; 438/622; 438/624; 438/626; 438/637; 438/687; 438/645; 438/692
(58) Field of Search .............................. 438/618, 622, 438/624, 631, 626, 629, 633, 637, 645, 669, 675, 687, 692; 257/758, 760, 774

(56) References Cited

U.S. PATENT DOCUMENTS

| | | | | |
|---|---|---|---|---|
| 5,243,222 A | * | 9/1993 | Harper et al. | 257/774 |
| 5,766,379 A | * | 6/1998 | Lanford et al. | 148/537 |
| 5,939,788 A | | 8/1999 | McTeer | |
| 6,022,808 A | * | 2/2000 | Nogami et al. | 438/694 |
| 6,043,153 A | | 3/2000 | Nogami et al. | |
| 6,046,108 A | * | 4/2000 | Liu et al. | 438/687 |
| 6,083,835 A | * | 7/2000 | Shue et al. | 438/687 |
| 6,228,759 B1 | * | 5/2001 | Wang et al. | 438/625 |
| 6,297,154 B1 | * | 10/2001 | Gross et al. | 438/663 |
| 6,339,022 B1 | * | 1/2002 | Ballantine et al. | 438/660 |
| 6,348,410 B1 | * | 2/2002 | Ngo et al. | 438/660 |
| 6,391,777 B1 | * | 5/2002 | Chen et al. | 438/687 |

\* cited by examiner

*Primary Examiner*—Amir Zarabian
*Assistant Examiner*—Maria Guerrero
(74) *Attorney, Agent, or Firm*—Tung & Associates

(57) ABSTRACT

Within a method for forming a patterned microelectronic layer there is first provided a substrate having an aperture formed therein. There is then formed over the substrate and filling the aperture a blanket microelectronic layer. There is then planarized, while employing a first planarizing method, the blanket microelectronic layer to form a once planarized patterned microelectronic layer within the aperture. There is then thermal annealed, while employing a thermal annealing method, the once planarized patterned microelectronic layer within the aperture to form a thermal annealed once planarized patterned microelectronic layer within the aperture. Finally, there is then planarized, while employing a second planarizing method, the thermal annealed once planarized patterned microelectronic layer within the aperture to form a thermal annealed twice planarized patterned microelectronic layer within the aperture. The method is particularly useful for forming, with enhanced integrity, and in particular enhanced physical integrity, such as but not limited to enhanced dimensional integrity, a patterned copper containing microelectronic conductor layer within an aperture within a substrate employed within a microelectronic fabrication.

17 Claims, 2 Drawing Sheets

MULTI-STEP PLANARIZING METHOD FOR FORMING A PATTERNED THERMALLY EXTRUDABLE MATERIAL LAYER

BACKGROUND OF THE INVENTION

1. Field of the Invention

The present invention relates generally to methods for forming patterned thermally extrudable material layers within microelectronic fabrications. More particularly, the present invention relates to planarizing methods for forming patterned thermally extrudable material layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common within the art of microelectronic fabrication to employ when fabricating patterned microelectronic conductor layers within microelectronic fabrications copper containing conductor materials, in place of more conventional aluminum containing conductor materials.

Copper containing conductor materials are desirable in the art of microelectronic fabrication for forming patterned microelectronic conductor layers within microelectronic fabrications, in place of more conventional aluminum containing conductor materials for forming patterned microelectronic conductor layers within microelectronic fabrications, insofar as patterned microelectronic conductor layers formed of copper containing conductor materials are generally less susceptible to detrimental effects, such as but not limited to detrimental electromigration effects.

While patterned microelectronic conductor layers formed of copper containing conductor materials are thus clearly desirable in the art of microelectronic fabrication, patterned microelectronic conductor layers formed of copper containing conductor materials are nonetheless not entirely without problems in the art of microelectronic fabrication. In that regard, it is known in the art of microelectronic fabrication that patterned microelectronic conductor layers formed of copper containing conductor materials are often difficult to form within microelectronic fabrications with enhanced integrity, and in particular with enhanced physical integrity, such as but not limited to enhanced dimensional integrity.

It is thus desirable in the art of microelectronic fabrication to provide methods for forming within microelectronic fabrications, with enhanced integrity, patterned microelectronic conductor layers formed of copper containing conductor materials.

It is towards the foregoing object that the present invention is more specifically directed.

Various methods have been disclosed in the art of microelectronic fabrication for forming, with desirable properties within microelectronic fabrications, patterned microelectronic conductor layers formed of copper containing conductor materials.

For example, McTeer, in U.S. Pat. No. 5,939,788, discloses a plurality of methods for forming, with enhanced manufacturing efficiency, patterned copper containing microelectronic conductor layers within apertures within substrates employed within microelectronic fabrications. To realize the foregoing result, a first representative method within the plurality of methods employs within a microelectronic fabrication a titanium aluminum nitride layer as a thermally stable barrier layer with respect to a patterned copper containing microelectronic conductor layer which is reflowed thereupon within the microelectronic fabrication. Similarly, and also to realize the foregoing object, a second representative method within the plurality of methods employs within a microelectronic fabrication an aluminum layer interposed between a barrier layer and a patterned copper containing microelectronic conductor layer such as to provide for a lowered reflow temperature of the patterned copper containing microelectronic conductor layer within the microelectronic fabrication.

In addition, Nogami et al., in U.S. Pat. No. 6,043,153, discloses a method for forming, with enhanced electromigration resistance, a patterned copper containing microelectronic conductor layer within an aperture within a substrate employed within a microelectronic fabrication. To realize the foregoing object, the method provides that there is first formed a blanket copper containing microelectronic conductor layer covering the substrate employed within the microelectronic fabrication and filling the aperture, and then planarized the blanket copper containing microelectronic conductor layer to form a patterned copper containing microelectronic conductor layer within the aperture, further wherein the patterned copper containing microelectronic conductor layer within the aperture is thermally annealed to form a thermally annealed patterned copper containing microelectronic conductor layer within the aperture prior to forming thereover a passivation layer.

Desirable in the art of microelectronic fabrication are additional methods which may be employed for forming within microelectronic fabrications, with enhanced integrity, patterned microelectronic conductor layers formed of copper containing conductor materials.

It is towards the foregoing object that the present invention is more specifically directed.

SUMMARY OF THE INVENTION

A first object of the present invention is to provide a method for forming within a microelectronic fabrication a patterned copper containing microelectronic conductor layer.

A second object of the present invention is to provide a method in accord with the first object of the present invention, wherein the patterned copper containing microelectronic conductor layer is formed with enhanced integrity.

A third object of the present invention is to provide a method in accord with the first object of the present invention and the second object of the present invention, wherein the method is readily commercially implemented.

In accord with the objects of the present invention, there is provided by the present invention a method for forming a patterned microelectronic layer within a microelectronic fabrication. To practice the method of the present invention, there is first provided a substrate having an aperture formed therein. There is then formed over the substrate and filling the aperture a blanket microelectronic layer. There is then planarized, while employing a first planarizing method, the blanket microelectronic layer to form a once planarized patterned microelectronic layer within the aperture. There is then thermally annealed, while employing a thermal annealing method, the once planarized patterned microelectronic layer within the aperture to form a thermal annealed once planarized patterned microelectronic layer within the aperture. Finally, there is then planarized, while employing a second planarizing method, the thermal annealed once planarized patterned microelectronic layer within the aperture to form a thermal annealed twice planarized patterned microelectronic layer within the aperture.

Within the present invention, when the blanket microelectronic layer is formed of a thermally extrudable material in general, such as but not limited to a thermally extrudable copper containing conductor material more particularly, the thermal annealed twice planarized patterned microelectronic layer, such as a thermal annealed twice planarized patterned copper containing conductor layer, is formed with enhanced integrity, and in particular enhanced physical integrity, such as but not limited to enhanced dimensional integrity.

The present invention provides a method for forming within a microelectronic fabrication a patterned copper containing microelectronic conductor layer, wherein the patterned copper containing microelectronic conductor layer is formed with enhanced integrity.

The present invention realizes the foregoing object by employing a two step planarizing method for forming within an aperture within a substrate employed within a microelectronic fabrication a planarized patterned copper containing conductor layer, further wherein within the two step planarizing method there is employed interposed between a pair of planarizing process steps which comprises the two step planarizing method a thermal annealing process step which also comprises the two step planarizing method.

The method of the present invention is readily commercially implemented.

The present invention employs methods and materials as are otherwise generally known in the art of microelectronic fabrication but employed within the context of a specific process ordering and specific series of process limitations to provide the present invention. Since it is thus at least in part a specific process ordering and a specific series of process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a patterned copper containing microelectronic conductor layer, wherein the patterned copper containing microelectronic conductor layer is formed with enhanced integrity.

The present invention realizes the foregoing object by employing a two step planarizing method for forming within an aperture within a substrate employed within a microelectronic fabrication a planarized patterned copper containing conductor layer, further wherein within the two step planarizing method there is employed interposed between a pair of planarizing process steps which comprises the two step planarizing method a thermal annealing process step which also comprises the two step planarizing method.

Although the preferred embodiment of the present invention provides particular value within the context of forming a patterned copper containing conductor layer which may be employed when fabricating a semiconductor integrated circuit microelectronic fabrication, the present invention may be employed for forming patterned copper containing conductor layers which may be employed when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although the present invention provides particular value within the context of forming a patterned copper containing conductor layer which may be employed in fabricating a semiconductor integrated circuit microelectronic fabrication, the present invention most generally may be employed for forming, with enhanced integrity, a patterned microelectronic layer within an aperture within a substrate which may be employed within any of the foregoing microelectronic fabrications, where the patterned microelectronic layer is formed in general of a thermally extrudable microelectronic material. Within the present invention, the thermally extrudable microelectronic material may be selected from the group consisting of thermally extrudable microelectronic conductor materials, thermally extrudable microelectronic semiconductor materials and thermally extrudable microelectronic dielectric materials. Similarly, the substrate having defined therein the aperture within which is formed the patterned microelectronic layer with enhanced integrity in accord with the present invention may also be formed of microelectronic materials selected from the group including but not limited to microelectronic conductor materials, microelectronic semiconductor materials and microelectronic dielectric materials.

Figure 1:
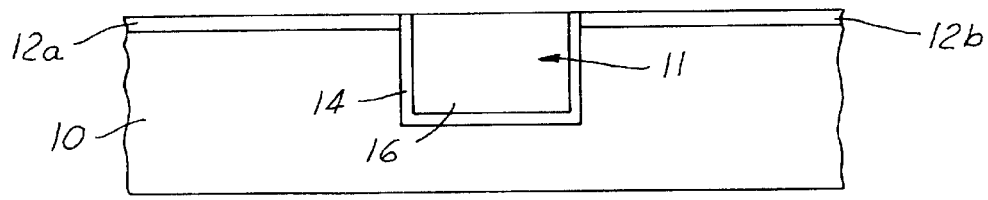
FIG. 1 and FIG. 2 show a pair of schematic cross-sectional diagrams illustrating the results of progressive stages of forming within a microelectronic fabrication a patterned copper containing conductor layer not in accord with the present invention.
Figure 2:
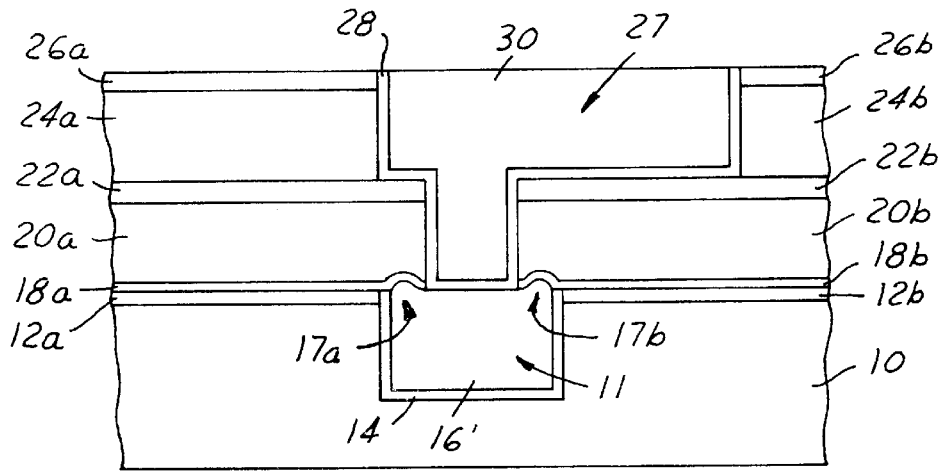

Referring now to FIG. 1 and FIG. 2, there is shown a pair of schematic cross-sectional diagrams illustrating the results of progressive stages of forming within a microelectronic fabrication a patterned copper containing conductor layer not in accord with the present invention.

Shown in FIG. 1 is a schematic cress-sectional diagram of the microelectronic fabrication at an early stage in its fabrication not in accord with the present invention.

Shown in FIG. 1, in a first instance, is a substrate 10 having formed therein an aperture 11 which is defined in part by a pair of patterned first polish stop layers 12a and 12b which are formed upon a surface of the substrate 10. As is further illustrated within the schematic cross-sectional diagram of FIG. 1, the aperture 11 in turn has formed therein a patterned conformal first barrier layer 14 which in turn has formed thereupon a patterned copper containing conductor layer 16.

As is understood by a person skilled in the art, the microelectronic fabrication whose schematic cross-sectional diagram is illustrated in FIG. 1 is typically and preferably formed employing a chemical mechanical polish (CMP) planarizing method which provides a chemical mechanical polish (CMP) planarizing of a blanket copper containing conductor layer formed upon a blanket conformal barrier layer, both of which are formed over the substrate 10 and the pair of patterned first polish stop layers 12a and 12b, and filling the aperture 11, and further wherein the pair of patterned first polish stop layers 12a and 12b serves as a pair of polish stop layers within the chemical mechanical polish (CMP) planarizing method.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed over the pair of patterned polish stop layers 12a and 12b, the patterned conformal first barrier layer 14 and the patterned copper containing conductor layer 16 an additional series of pairs of patterned layers comprising: (1) a pair of patterned second barrier layers 18a and 18b, having formed thereupon; (2) a pair of patterned first inter-metal dielectric (IMD) layers 20a and 20b, in turn having formed thereupon; (3) a pair of patterned etch stop layers 22a and 22b, in turn having formed thereupon; (4) a pair of patterned second inter-metal dielectric (IMD) layers 24a and 24b, finally in turn having formed thereupon; (4) a pair of patterned second polish stop layers 26a and 26b.

As is understood by a person skilled in the art, each of the foregoing pairs of patterned layers within the additional series of pairs of patterned layers may be formed employing methods and materials as are otherwise generally conventional in the art of microelectronic fabrication. Typically and preferably the pair of patterned first inter-metal dielectric (IMD) layers 20a and 20b, as well as the pair of patterned second inter-metal dielectric (IMD) layers 24a and 24b are formed of a single dielectric material. Similarly, typically and preferably, the pair of patterned second barrier layers 18a and 18b is formed of a barrier material intended to inhibit interdiffusion of the patterned copper containing conductor layer 16 with the pair of patterned first inter-metal dielectric (IMD) layers 20a and 20b. Finally, the pair of patterned etch stop layers 22a and 22b and the pair of patterned second polish stop layers 26a and 26b are positioned and sized such that there is formed accessing a portion of the patterned copper containing conductor layer 16 a dual damascene aperture 27 (i.e., a trench of areal dimension greater than, completely overlapping and contiguous with a via which accesses the patterned copper containing conductor layer 16) as illustrated within the schematic cross-sectional diagram of FIG. 2.

Finally, there is also shown within the schematic cross-sectional diagram of FIG. 2, and filling the dual damascene aperture 27 a patterned conformal third barrier layer 28 having formed thereupon a contiguous patterned conductor interconnect and patterned conductor stud layer 30, both of which are typically and preferably formed employing a chemical mechanical polish (CMP) planarizing method analogous or equivalent to the chemical mechanical polish (CMP) planarizing method as is employed for forming the patterned conformal first barrier layer 14 having formed thereupon the patterned copper containing conductor layer 16 as is illustrated in FIG. 1.

As is illustrated within the schematic cross-sectional diagram of FIG. 2, and incident to forming the series of pairs of patterned layers upon the microelectronic fabrication whose schematic cross-sectional diagram is illustrated in FIG. 1 to provide the microelectronic fabrication whose schematic cross-sectional diagram is illustrated in FIG. 2, there is often formed within the patterned copper containing conductor layer 16 as illustrated within the schematic cross-sectional diagram of FIG. 1 at least one hillock, and more typically at least a pair of hillocks 17a and 17b as illustrated within the schematic cross-sectional diagram of FIG. 2, to provide a deformed patterned copper containing conductor layer 16' as is illustrated within the schematic cross-sectional diagram of FIG. 2. Such a deformed patterned copper containing conductor layer 16' as is illustrated within the schematic cross-sectional diagram of FIG. 2 is undesirable in the art of microelectronic fabrication insofar as it provides for thinning of the pair of patterned second barrier layers 18a and 18b, such that there may eventually result interdiffusion of a copper containing conductor material from which is formed the deformed patterned copper containing conductor layer 16' with a dielectric material from which is formed the pair of patterned first inter-metal dielectric (IMD) layers 20a and 20b, thus in turn providing for compromised integrity of the microelectronic fabrication whose schematic cross-sectional diagram is illustrated in FIG. 2.

It is thus towards avoidance of defects, such as the pair of hillocks 17a and 17b within the deformed patterned copper containing conductor layer 16' within the aperture 11 within the substrate 10 within the microelectronic fabrication whose schematic cross-sectional diagram is illustrated in FIG. 2 that the present invention is directed, such as to provide within the microelectronic fabrication whose schematic cross-sectional diagram is illustrated in FIG. 2 a patterned copper containing conductor layer with enhanced integrity.

Referring now to FIG. 3 to FIG. 7, there is shown a series of schematic cross-sectional diagrams illustrating the results of progressive stages of forming within a microelectronic fabrication a patterned copper containing conductor layer in accord with the present invention.

Figure 3:
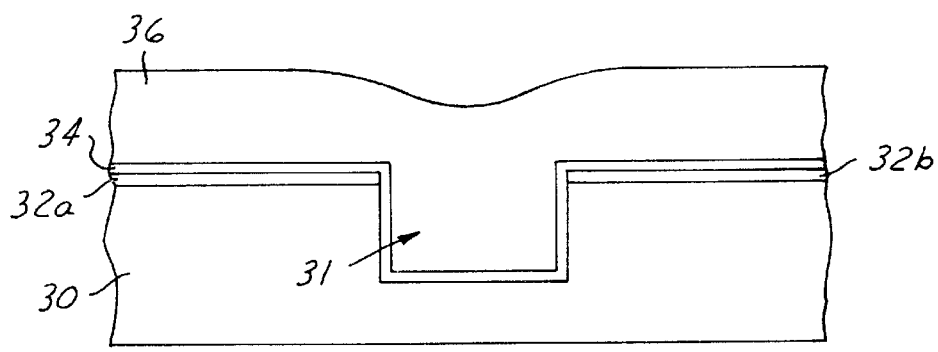
FIG. 3, FIG. 4, FIG. 5, FIG. 6 and FIG. 7 show a series of schematic cross-sectional diagrams illustrating the results of progressive stages of forming within a microelectronic fabrication a patterned copper containing conductor layer in accord with the present invention.

Shown in FIG. 3 is a schematic cross-sectional diagram of the microelectronic fabrication at an early stage in its fabrication in accord with the preferred embodiment of the present invention.

Shown in FIG. 3 is a substrate 30 having formed therein an aperture 31 defined in part by a pair of patterned first polish stop layers 32a and 32b formed upon the substrate 30 and adjoining the aperture 31, wherein the substrate 30, the aperture 31 and the pair of patterned first polish stop layers 32a and 32b correspond generally with the substrate 10, the aperture 11 and the pair of patterned first polish stop layers 12a and 12b as illustrated within the schematic cross-sectional diagram of FIG. 1.

Within the preferred embodiment of the present invention with respect to the substrate 30, the substrate 30 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 3, the substrate 30 may consist of a substrate alone as employed within a microelectronic fabrication, or in an alternative, the substrate 30 may comprise a substrate as employed within a microelectronic fabrication, where the substrate has formed thereupon and/or thereover any of several additional microelectronic layers as are conventionally employed within the microelectronic fabrication within which is employed the substrate. Analogously with the substrate alone as employed within the microelectronic fabrication, the additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 3, the substrate 30, typically and preferably, but not exclusively, when the substrate 30 consists of or comprises a semiconductor substrate employed within a semiconductor integrated circuit microelectronic fabrication, has formed therein and/or thereupon microelectronic devices as are conventional within the microelectronic fabrication within which is employed the substrate 30. Such microelectronic devices may include, but are not limited to resistors, transistors, diodes and capacitors.

Within the preferred embodiment of the present invention with respect to the aperture 31, the aperture 31 typically and preferably has an aperture depth within the substrate 30 of from about 5000 to about 10000 angstroms and a bidirectional (i.e., areal) aperture width within the substrate 30 of from about 0.1 to about 2 microns.

Within the preferred embodiment of the present invention with respect to the pair of patterned polish stop layers 32a and 32b, the pair of patterned polish stop layers 32a and 32b will typically and preferably be formed of a dense polish stop material, such as but not limited to a dense silicon nitride polish stop material, typically and preferably formed to a thickness of from about 300 to about 1000 angstroms upon the substrate 30 and defining in part the aperture 31.

Within the preferred embodiment of the present invention with respect to the blanket conformal first barrier layer 34, the blanket conformal first barrier layer 34 may be formed of any of several barrier materials as may be employed for forming the patterned conformal first barrier layer 14 as illustrated within the schematic cross-sectional diagram of FIG. 1, including but not limited to dielectric barrier materials and conductor barrier materials, but preferably conductor barrier materials, such as but not limited to tantalum, titanium, tantalum nitride and titanium nitride barrier materials or other barrier materials as are more specifically disclosed within the Related Art references as disclosed within the Description of the Related Art. Typically and preferably, the blanket conformal first barrier layer 34 is formed to a thickness of from about 50 to about 500 angstroms.

Finally, within the preferred embodiment of the present invention with respect to the blanket copper containing conductor layer 36, the blanket copper containing conductor layer 36 may be formed of copper containing conductor materials as are known in the art of microelectronic fabrication, including but not limited to copper and copper alloys of greater than about 98 weight percent copper and more typically and preferably greater than about 99 weight percent copper. Typically and preferably, the blanket copper containing conductor layer 36 is formed to a thickness of from about 4000 to about 20000 angstroms, typically and preferably, but not exclusively, while employing an electrochemical deposition method.

As is understood by a person skilled in the art, and also in accord with the Related Art disclosures within the Description of the Related Art, typically and preferably, the blanket copper containing conductor layer 36 as illustrated within the schematic cross-sectional diagram of FIG. 3 receives minimal if any thermal annealing processing incident to or immediately subsequent to its formation, such as not to unnecessarily induce within the blanket copper containing conductor layer 36 any crystalline defects or void defects when forming the blanket copper containing conductor layer 36. Typically and preferably, the blanket copper containing conductor layer 36 may be thermally annealed incident to or immediately subsequent to its formation at a temperature of no greater than about 300 degrees centigrade and more preferably at a temperature of from about 100 to about 250 degrees centigrade, for a time period of no greater than about 30 minutes and more preferably from about 0.5 to about 2 minutes, within a non-oxidizing atmosphere, such as but not limited to a nitrogen, hydrogen or forming gas atmosphere.

Figure 4:
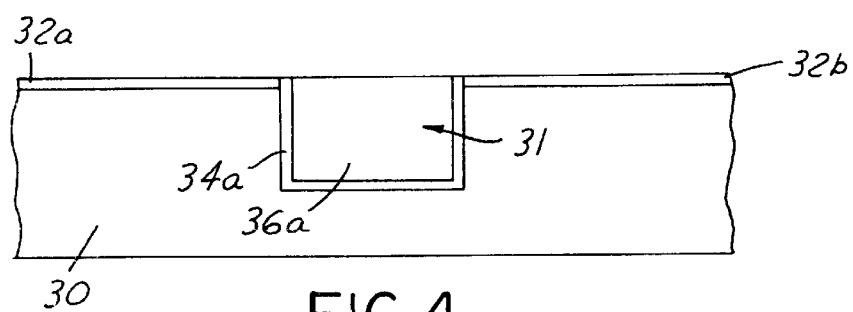

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket copper containing conductor layer 36 has been planarized while employing a first planarizing method, to form from the blanket copper containing conductor layer 36 as illustrated within the schematic cross-sectional diagram of FIG. 3 a once planarized patterned copper containing conductor layer 36a in turn formed upon a patterned conformal first barrier layer 34a in turn formed within the aperture 31 formed within the substrate 30.

Within the preferred embodiment of the present invention with respect to the first planarizing method which may be employed for forming from the blanket copper containing conductor layer 36 as illustrated within the schematic cross-sectional diagram of FIG. 3 the once planarized patterned copper containing conductor layer 36a as illustrated within the schematic cross-sectional diagram of FIG. 4, the planarizing method may include, but is not limited to vacuum ion planarizing methods (such as but not limited to reactive ion etch (RIE) planarizing methods and physical ion etch sputtering planarizing methods), chemical planarizing methods, mechanical planarizing methods and more typically and preferably chemical mechanical polish (CMP) planarizing methods, which in turn may employ ancillary methods and materials as are otherwise conventional in the art of microelectronic fabrication, and as are appropriate for the copper containing conductor material from which is formed the blanket copper containing conductor layer 36.

Figure 5:
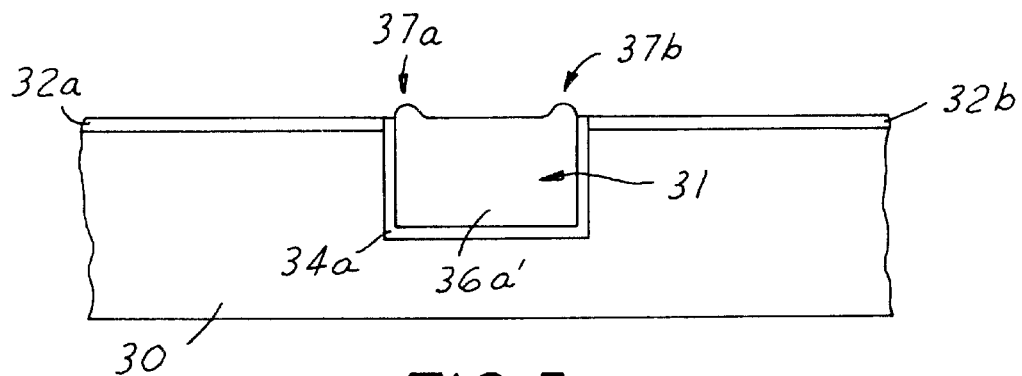

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the microelectronic fabrication has been thermally annealed to form from the once planarized patterned copper containing conductor layer 36a as illustrated within the schematic cross-sectional diagram of FIG. 4 a once thermal annealed once planarized patterned copper containing conductor layer 36a' upon the patterned conformal first barrier layer 34a within the aperture 31 within the substrate 30.

Within the preferred embodiment of the present invention, and as is illustrated within the schematic cross-sectional diagram of FIG. 5, the once thermal annealed once planarized patterned copper containing conductor layer 36a' has a pair of hillocks 37a and 37b formed within its upper surface. The pair of hillocks 37a and 37b as formed within the upper surface of the once thermal annealed once planarized patterned copper containing conductor layer 36a' result directly from the thermal annealing method, in conjunction with a thermally extrudable character of the copper containing conductor material from which is formed the thermal annealed once planarized patterned copper containing conductor layer 36a'.

Within the preferred embodiment of the present invention, the thermal annealing method which is employed for forming from the once planarized patterned copper containing conductor layer 36a as illustrated within the schematic cross-sectional diagram of FIG. 4 the thermal annealed once planarized patterned copper containing conductor layer 36a' as illustrated within the schematic cross-sectional diagram of FIG. 5 employs a thermal annealing temperature from about 250 to about 400 degrees centigrade, more typically and preferably from about 300 to about 400 degrees centigrade, for a time period of from about 0.5 to about 30 minutes, more typically and preferably from about 0.5 to about 2 minutes, and also within a non-oxidizing atmosphere, such as but not limited to a nitrogen, hydrogen or forming gas atmosphere. The thermal annealing is undertaken such as to provide optimized electrical properties of the thermal annealed once planarized patterned copper containing conductor layer 36a'.

Figure 6:
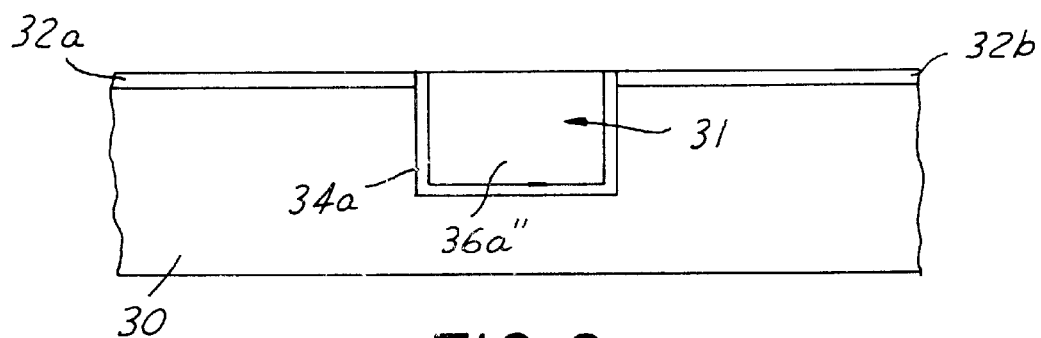

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the thermal annealed once planarized patterned copper containing conductor layer 36a' as illustrated within the schematic cross-sectional diagram of FIG. 5 has been again planarized while employing a second planarizing method, to yield a thermal annealed twice planarized patterned copper containing conductor layer 36a" which has planarized therefrom the pair of hillocks 37a and 37b to once again provide a planar surface within the thermal annealed twice planarized patterned copper containing conductor layer 36a".

Within the preferred embodiment of the present invention with respect to the second planarizing method, the second planarizing method may employ planarizing methods and materials analogous or equivalent to the planarizing methods and materials as may be employed within the first planarizing method for forming from the blanket copper containing conductor layer 36 as illustrated within the schematic cross-sectional diagram of FIG. 3 the once planarized patterned copper containing conductor layer 36a as illustrated within the schematic cross-sectional diagram of FIG. 4. Similarly, and also in accord with the first planarizing method, the second planarizing method typically and preferably employs a chemical mechanical polish (CMP) planarizing method.

Figure 7:
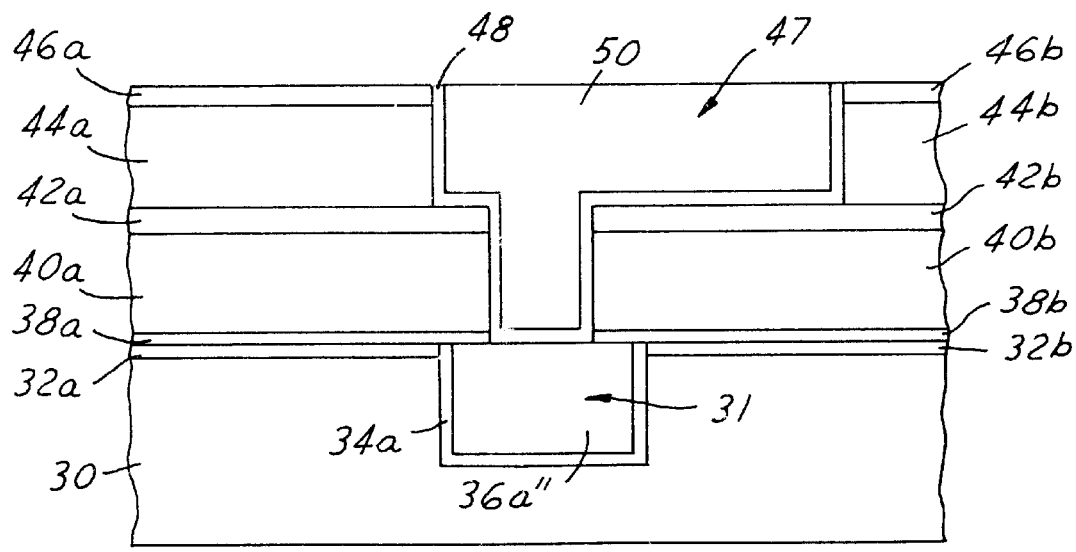

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein there is formed upon the pair of patterned first etch stop layers 32a and 32b, the patterned conformal first barrier layer 34a and the thermal annealed twice planarized patterned copper containing conductor layer 36a": (1) a pair of patterned second barrier layers 38a and 38b, having formed thereupon; (2) a pair of patterned first inter-metal dielectric (IMD) layers 40a and 40b, in turn having formed thereupon; (3) an optional pair of patterned etch stop layers 42a and 42b, in turn having formed thereupon; (4) a pair of patterned second inter-metal dielectric (IMD) layers 44a and 44b, finally in turn having formed thereupon; (5) an optional pair of patterned polish stop layers 46a and 46b, wherein the foregoing series of pairs of patterned layers define, as is illustrated within the schematic cross-sectional diagram of FIG. 7, a dual damascene aperture 47 comprising a trench larger than, completely overlapping and contiguous with a via accessing the thermal annealed twice planarized patterned copper containing conductor layer 36a".

As is understood by a person skilled in the art, each of the foregoing pairs of patterned layers which comprise the dual damascene aperture 47 is formed from a corresponding series of blanket layers which are photolithographically masked and etched to provide the dual damascene aperture 47. As is understood by a person skilled in the art, when forming the dual damascene aperture 47, either the trench or the via may be formed first.

As is further understood by a person skilled in the art, various of the foregoing pairs of layers are formed employing methods, materials and thickness dimensions as are conventional in the art of microelectronic fabrication, and will typically include methods which provide deposition temperatures in a range generally greater than about 300 degrees centigrade and more specifically in a range of about 300 to about 400 degrees centigrade, at which deposition temperature the thermal annealed twice planarized patterned copper containing conductor layer 36a" would otherwise have generated hillock defects (in accord with the schematic cross-sectional diagram of FIG. 2) were it only once planarized and not thermal annealed. Although not specifically illustrated within the schematic cross-sectional diagram of FIG. 7, it is also common within the art of microelectronic fabrication to employ a nitrogen plasma treatment, or more preferably an ammonia plasma treatment, to passivate the thermal annealed twice planarized patterned copper containing conductor layer 36a" prior to forming thereover the series of pairs of layers as illustrated within the schematic cross-sectional diagram of FIG. 7. Such plasma treatments are generally provided at a temperature of greater than about 300 degrees centigrade and more specifically from about 300 to about 400 degrees centigrade, and would similarly also induce hillock formation within the thermal annealed twice planarized patterned copper containing conductor layer 36a" were it only once planarized and not thermal annealed.

Finally, there is also illustrated within the schematic cross-sectional diagram of FIG. 7, and formed into the dual damascene aperture 47 a patterned conformal third barrier layer 48 having formed thereupon a contiguous patterned conductor interconnect and patterned conductor stud layer 50.

Within the preferred embodiment of the present invention, the patterned conformal third barrier layer 48 and the contiguous patterned conductor interconnect and patterned conductor stud layer 50 are formed employing planarizing methods and materials analogous or equivalent to the planarizing methods and materials employed for forming the patterned conformal first barrier layer 34a and the once planarized patterned copper containing conductor layer 36a as also illustrated within the schematic cross-sectional diagram of FIG. 4.

Upon forming the microelectronic fabrication whose schematic cross-sectional diagram is illustrated in FIG. 7, there is formed a microelectronic fabrication having formed therein a patterned copper containing conductor layer with enhanced integrity, and in particular with enhanced physical integrity, such as but not limited to enhanced dimensional integrity. The present invention realizes the foregoing object by employing when forming the patterned copper containing conductor layer from a corresponding blanket copper containing conductor layer a two step planarizing method employing a thermal annealing process step interposed between a pair of planarizing process steps employed within the two step planarizing method. The two step planarizing method employing the thermal annealing process step interposed between the pair of planarizing process steps for forming the patterned copper containing conductor layer is employed prior to additional thermal processing (such as but not limited to thermal processing induced microelectronic layer deposition processing) of the microelectronic fabrication having formed therein the patterned copper containing conductor layer.

As is understood by a person skilled in the art, the preferred embodiment of the present invention is illustrative of the present invention rather than limiting of the present invention. Revisions and modifications may be made to methods, materials, structures and dimensions through which is provided a microelectronic fabrication in accord with the preferred embodiment of the present invention while still providing a method for forming a patterned microelectronic layer in accord with the present invention, further in accord with the accompanying claims.

What is claimed is:

1. A method for forming a patterned microelectronic layer comprising:
    providing a substrate having an aperture formed therein;
    forming over the substrate and filling the aperture a blanket microelectronic layer;
    planarizing, while employing a first planarizing method, the blanket microelectronic layer to form a once planarized patterned microelectronic layer within the aperture;
    thermal annealing, while employing a thermal annealing method, the once planarized patterned microelectronic layer within the aperture to form a thermal annealed once planarized patterned microelectronic layer within the aperture; and
    planarizing, while employing a second planarizing method, the thermal annealed once planarized patterned microelectronic layer within the aperture to form a thermal annealed twice planarized patterned microelectronic layer within the aperture.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the substrate is formed from a microelectronic material selected from the group consisting of microelectronic conductor materials, microelectronic semiconductor materials and microelectronic dielectric materials.

4. The method of claim 1 wherein the blanket microelectronic layer is formed from a microelectronic material selected from the group consisting of microelectronic conductor materials, microelectronic semiconductor materials and microelectronic dielectric materials.

5. The method of claim 1 wherein the blanket microelectronic layer is formed from a thermally extrudable microelectronic material.

6. The method of claim 1 wherein each of the first planarizing method and the second planarizing method is selected from the group consisting of vacuum ion planarizing methods, chemical planarizing methods, mechanical planarizing methods and chemical mechanical polish (CMP) planarizing methods.

7. The method of claim 1 wherein:
    upon thermal annealing the once planarized patterned microelectronic layer there is formed a hillock within the thermal annealed once planarized patterned microelectronic layer; and
    the hillock is planarized within the second planarizing method when forming the thermal annealed twice planarized patterned microelectronic layer.

8. The method of claim 1 wherein the once planarized patterned microelectronic layer is thermally annealed within a non-oxidizing atmosphere.

9. A method for forming a patterned copper containing conductor layer comprising:
    providing a substrate having an aperture formed therein;
    forming over the substrate and filling the aperture a blanket copper containing conductor layer;
    planarizing, while employing a first planarizing method, the blanket copper containing conductor layer to form a once planarized patterned copper containing conductor layer within the aperture;
    thermal annealing, while employing a thermal annealing method, the once planarized patterned copper containing conductor layer to form a thermal annealed once planarized patterned copper containing conductor layer within the aperture; and
    planarizing, while employing a second planarizing method, the thermal annealed once planarized patterned copper containing conductor layer to form a thermal annealed twice planarized patterned copper containing conductor layer within the aperture.

10. The method of claim 9 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

11. The method of claim 9 wherein the aperture is formed with a depth of from about 5000 to about 10000 angstroms and a bidirectional areal linewidth of from about 0.1 to about 2 microns.

12. The method of claim 9 wherein the blanket copper containing conductor layer is formed to a thickness of from about 4000 to about 20000 angstroms.

13. The method of claim 9 wherein the once planarized patterned copper containing conductor layer is thermal annealed at a temperature of from about 300 to about 400 degrees centigrade.

14. The method of claim 9 wherein the once planarized patterned copper containing conductor layer is thermally extrudable.

15. The method of claim 9 wherein each of the first planarizing method and the second planarizing method is selected from the group consisting of vacuum ion planarizing methods, chemical planarizing methods, mechanical planarizing methods and chemical mechanical polish (CMP) planarizing methods.

16. The method of claim 9 wherein:
upon thermal annealing the once planarized patterned copper containing conductor layer there is formed a hillock within the thermal annealed once planarized patterned copper containing conductor layer; and
the hillock is planarized within the second planarizing method when forming the thermal annealed twice planarized patterned copper containing conductor layer.

17. The method of claim 9 wherein the once planarized patterned copper containing conductor layer is thermally annealed within a non-oxidizing atmosphere.

* * * * *